(12) United States Patent
Sundaram et al.

(10) Patent No.: US 7,319,616 B2
(45) Date of Patent: Jan. 15, 2008

(54) NEGATIVELY BIASING DESELECTED MEMORY CELLS

(75) Inventors: Rajesh Sundaram, Folsom, CA (US); Jahanshir Javanifard, Carmichael, CA (US); Kerry D. Tedrow, Folsom, CA (US); Priya Walimbe, Folsom, CA (US); Tom H. Ly, Rancho Cordova, CA (US); Raymond W. Zeng, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 10/713,841

(22) Filed: Nov. 13, 2003

(65) Prior Publication Data

US 2005/0105338 A1 May 19, 2005

(51) Int. Cl.
*G11C 16/06* (2006.01)

(52) U.S. Cl. ............................ 365/185.23; 365/230.06; 365/185.18

(58) Field of Classification Search ........... 365/185.18, 365/185.23, 185.33, 185.28, 185.26, 230.06
See application file for complete search history.

(56) References Cited

U.S. PATENT DOCUMENTS

| | | | | |
|---|---|---|---|---|
| 5,537,362 A | * | 7/1996 | Gill et al. ................. | 365/233.5 |
| 5,579,261 A | * | 11/1996 | Radjy et al. ........... | 365/185.33 |
| 5,734,603 A | * | 3/1998 | Tai .............................. | 365/149 |
| 5,801,991 A | | 9/1998 | Keeny et al. .......... | 365/185.23 |
| 5,818,758 A | | 10/1998 | Wojciechowski ...... | 365/185.18 |
| 5,870,348 A | * | 2/1999 | Tomishima et al. .... | 365/230.06 |
| 5,894,435 A | * | 4/1999 | Nobukata .............. | 365/185.03 |
| 5,973,963 A | * | 10/1999 | Sugawara .............. | 365/185.23 |
| 6,058,060 A | * | 5/2000 | Wong ......................... | 365/218 |
| 6,172,927 B1 | * | 1/2001 | Taylor ........................ | 365/219 |
| 6,236,598 B1 | * | 5/2001 | Chou .................... | 365/189.06 |
| 6,285,593 B1 | * | 9/2001 | Wong .................... | 365/185.23 |
| 6,356,481 B1 | * | 3/2002 | Micheloni et al. ..... | 365/185.23 |
| 6,377,508 B1 | * | 4/2002 | Tomishima et al. .... | 365/230.06 |
| 6,463,004 B2 | | 10/2002 | Guliani et al. ......... | 365/230.03 |
| 6,515,901 B2 | | 2/2003 | Underwood ........... | 365/185.18 |
| 6,535,430 B2 | * | 3/2003 | Ogura et al. ........... | 365/185.23 |
| 6,621,745 B1 | * | 9/2003 | Manea ................... | 365/185.23 |
| 6,804,148 B2 | * | 10/2004 | Bedarida et al. ........ | 365/185.13 |
| 2002/0074569 A1 | * | 6/2002 | Taniguchi ................... | 257/200 |
| 2003/0006742 A1 | | 1/2003 | Jahanshir et al. ........... | 323/282 |
| 2004/0076037 A1 | * | 4/2004 | Bedarida et al. ....... | 365/185.13 |

* cited by examiner

*Primary Examiner*—Thong Q. Le
(74) *Attorney, Agent, or Firm*—Trop, Pruner & Hu, P.C.

(57) ABSTRACT

In one embodiment, the present invention includes a method to supply a negative voltage to at least one deselected wordline of a memory array. Further, while the negative voltage is supplied to deselected wordlines, a positive voltage may be supplied to a selected wordline. The memory array may be a flash memory incorporating multi-level cell architecture, in one embodiment.

22 Claims, 3 Drawing Sheets

NEGATIVELY BIASING DESELECTED MEMORY CELLS

BACKGROUND

Nonvolatile memory devices such as electrically programmable read-only memories (EPROMS), electrically erasable programmable read only memories (EEPROMS) and flash memories include an array of nonvolatile memory cells and circuitry to access the array. Nonvolatile memory cells typically have a field effect transistor that includes a control gate to control operation of the memory cell and a floating gate to store data. Certain flash memory devices may incorporate multi-level cell (MLC) technology such that multiple bits of data may be stored in each memory cell. For example, a memory cell can store two bits of data via four bit patterns, namely 00, 01, 10 and 11. Each bit pattern may be represented by a state, such as a range of threshold voltages $V_T$ of the memory cell or the like.

In programming a flash memory, a selected wordline and a selected bitline are biased at determined voltages to program a given memory cell located at the intersection of the selected lines. However, during such programming, because the selected bitline is typically taken to a high voltage, deselected memory cells connected to the selected bitline also see a high voltage that is coupled to the floating gate of the cells, causing an initial drain turn on (IDTO) leakage current through the deselected cells. This leakage is significant and causes several adverse effects, including cycling performance degradation, increased die size, and lower read windows between voltage threshold levels of a selected cell (which is critical for MLC performance). Similar leakage currents can occur during other memory operations, such as during read, erase, and verify operations. Thus a need exists to improve the operation of such memory arrays.

DETAILED DESCRIPTION

Figure 1:
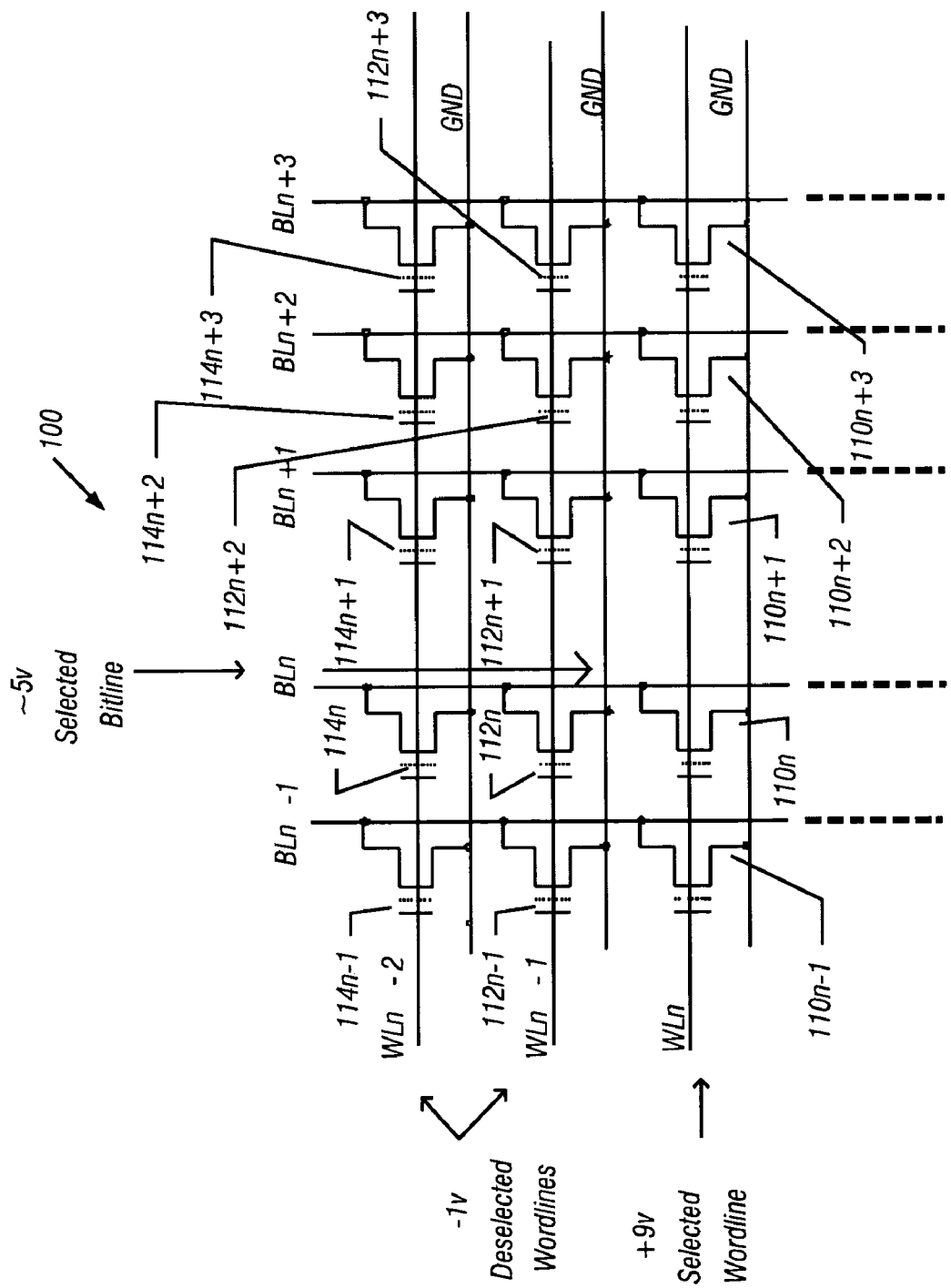
FIG. 1 is a schematic diagram of a memory array in accordance with one embodiment of the present invention.

Referring now to FIG. 1, shown is a schematic diagram of a memory array in accordance with one embodiment of the present invention. As shown in FIG. 1, memory array 100 includes a plurality of memory cells formed at the intersections of wordlines (e.g., $WL_n$) and bitlines (e.g., $BL_n$). Wordlines may also be referred to as address lines, in certain embodiments. Each memory cell includes a control or select gate and a floating gate. As shown in FIG. 1, each memory cell has a select gate coupled to a wordline, and a terminal or electrode coupled to a bitline and another terminal or electrode coupled to a source line. In such manner, each memory cell is uniquely addressable via a selected wordline and bitline (i.e., row and column). While the memory array of FIG. 1 may be a flash memory array, in other embodiments, the memory array may be a silicon oxide-nitride-oxide-silicon (SONOS) memory incorporating a mirror bit technology, or other memory arrays incorporating multiple bit technology.

In the embodiment of FIG. 1, memory cell $110_n$, for example, includes a drain terminal coupled to bitline $BL_n$, a select gate coupled to wordline $WL_n$, and a source terminal coupled to a common source line (shown in FIG. 1 as coupled to ground (GND)).

It is to be understood that each memory cell of memory array 100 is similarly coupled to an associated wordline, bitline, and source line. For example, memory cells $110_{n-1}$, and $110_{n+1}$-$110_{n+3}$ are each coupled to wordline $WL_n$ and a respective one of bitlines $BL_{n-1}$ and $BL_{n+1}$-$BL_{n+3}$. Further, each of these memory cells has a source terminal coupled to the common source line. Also shown in FIG. 1, memory array 100 includes a second plurality of memory cells $112_{n-1}$, . . . $112_{n+3}$ each having a select gate coupled to wordline $WL_{n-1}$, a source terminal coupled to a common source line (e.g., GND), and a drain terminal coupled to a respective one of bitlines $BL_{n-1}$-$BL_{n+3}$. Also, a third plurality of memory cells $114_{n-1}$, . . . $114_{n+3}$ is shown in FIG. 1, each having a select gate coupled to wordline $WL_{n-2}$, a source terminal coupled to a common source line (e.g., GND), and a drain terminal coupled to a respective one of bitlines $BL_{n-1}$-$BL_{n+3}$.

As shown in FIG. 1, wordline $WL_n$ is selected for programming. A wordline may be selected for programming by providing a high voltage signal to the wordline. While programming pulses may vary in different embodiments, in certain embodiments incorporating MLC architecture, a voltage between approximately 6-10 volts may be used, and in one embodiment, the wordline may be set at approximately 9 volts to appropriately bias the select gate of memory cells $110_{n-1}$, . . . $110_{n+3}$ coupled to wordline $WL_n$.

Further shown in FIG. 1, during a programming activity a bitline is selected (e.g., $BL_n$), and is provided with a voltage. For example, in a programming operation for a MLC, a selected bitline may be provided with a voltage between approximately 4-7 volts. In the embodiment shown in FIG. 1, bitline $BL_n$ may be provided with a voltage of approximately 5 volts. In such manner, the drain terminal of selected memory cell $110_n$ is biased between approximately 4-7 volts. Because the selected bitline is taken to a high voltage, deselected memory cells (e.g., $112_n$ and $114_n$) also connected to the selected bitline also see the high voltage that couples to the wordlines of deselected cells, causing the IDTO leakage (shown in FIG. 1 as a bold arrow extending down bitline $BL_n$).

When wordline $WL_n$ is selected for programming, other wordlines, including wordlines $WL_{n-1}$ and $WL_{n-2}$ shown in FIG. 1 are deselected. In various embodiments of the present invention, such deselected wordlines may be provided with a negative voltage during certain portions of erasing and programming activities. For example, a negative voltage may be applied during erase operations, such as preconditioning and pulse conditioning, in addition to programming activities. In such manner, leakage in deselected memory cells coupled to a selected bitline may be reduced.

While the desired negative voltage provided to deselected wordlines may vary in different embodiments, in one embodiment, a negative voltage of approximately −1 volt may be provided. As used herein, deselected wordlines supplied with a negative bias voltage may be termed "negative deselected rows" or "NDRs". Further, memory operations in which such a negative bias voltage is supplied may be referred to as an "NDR mode" of operation.

Figure 2:
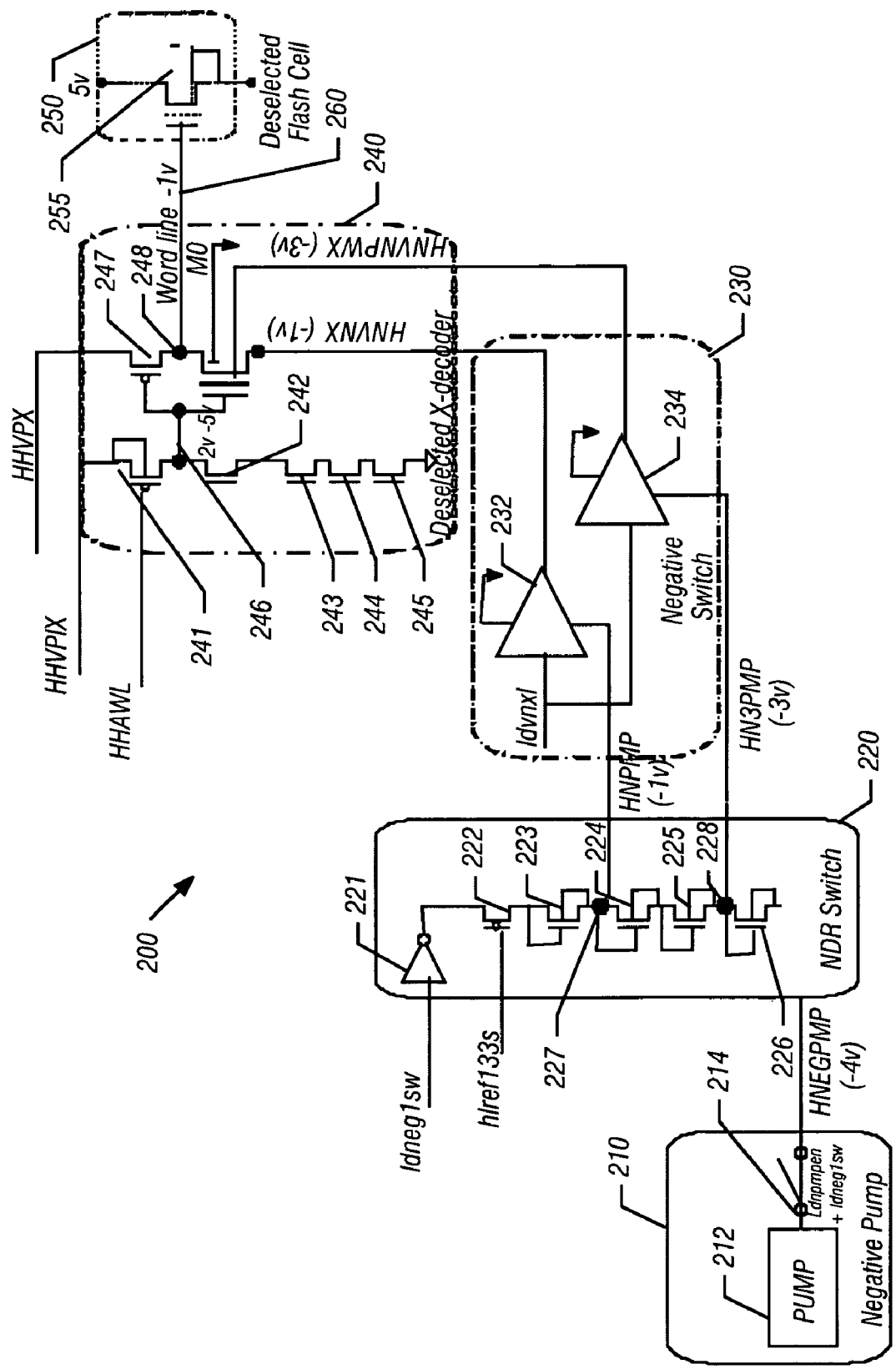
FIG. 2 is a schematic diagram of control circuitry in accordance with one embodiment of the present invention.

Referring now to FIG. 2, shown is a schematic diagram of control circuitry in accordance with one embodiment of the present invention. As shown in FIG. 2, control circuitry 200 may be used to provide a desired negative voltage to one or more deselected wordlines of a memory array.

As shown in FIG. 2, a negative charge pump 210 may include a negative pump 212 and a switch 214. Switch 214 may be controlled via signals from additional control circuitry (not shown in FIG. 2). Negative pump 210 may be used to supply a negative voltage to a NDR mode select switch 220. In one embodiment, two control signals, ldnpmpen and ldneg1sw may be used to determine a desired output from negative pump 210. Specifically, in one embodiment if the ldnpmpen signal is a logic low, the switch 214 is open and a ground potential is present. Alternately, if the ldnpmpen signal is a logic high and the ldneg1sw switch is a logic low, a −8 volt signal may be output from negative pump 210. When both control signals are logic high, a −4 volt signal may be output from negative pump 210. As shown in FIG. 2, a negative voltage of −4 volts may be supplied by negative pump 210 as HNEGPMP. A single negative pump 210 may be present in a memory device in accordance with one embodiment of the present invention.

Further shown in FIG. 2 is NDR mode switch 220, which may be used to generate desired negative voltages for biasing decoders and deselected wordlines coupled thereto. As with negative pump 210, a single NDR mode switch may be present in a memory device in accordance with one embodiment of the present invention. NDR mode switch 220 may operate generally as a voltage divider to provide multiple negative voltages.

As shown in FIG. 2, NDR mode switch 220 is coupled to receive the HNEGPMP signal from negative pump 210. In the embodiment of FIG. 2, NDR switch 220 may include an inverter 221, a depleted mode N-channel transistor 222 and four triple well N-type transistors (223-226) coupled in series. As shown in FIG. 2, transistor 222 has a gate terminal coupled to receive signal hlref133s from additional control circuitry, a source terminal coupled to an output of inverter 221 and a drain terminal coupled to a drain terminal of transistor 223.

As further shown in FIG. 2, each of transistors 223-226 has a drain terminal coupled to its gate terminal and a source terminal coupled to the substrate of the respective transistor. In such manner, when inverter 221 is enabled by the ldneg1sw signal, and the hlref133s signal turns on transistor 222, NDR mode switch 220 may generate a first negative voltage at node 227 and a second negative voltage at node 228. In the embodiment of FIG. 2, first negative voltage may be a −1 volt signal (HNPMP) and second negative voltage may be a −3 volt signal (HN3PMP).

However, it is to be understood that in other embodiments, the values of first and second negative voltages may differ. For example, NDR switch 220 may be biased to provide a −0.5 volt signal via node 227, in other embodiments. In one such embodiment, additional N-type transistors may be coupled in series to the transistors within NDR switch 220. Specifically, two additional N-type transistors may be coupled in series to transistor 226. Further, the HNEGPMP signal may be provided to a source terminal of the lowest such transistor. The source terminals of transistor 226 and the lowest-most transistor may be coupled together such that NDR switch 220 acts as a voltage divider with different voltages available at nodes 227 and 228. More so, in such an embodiment, the ldneg1sw signal may be used to control a gate of an N-channel pass transistor that acts to short transistor 226 with the lowest most transistor, enabling different voltage values on nodes 227 and 228.

As further shown in FIG. 2, the first and second negative voltages from NDR mode switch 220 are provided to a negative switch 230, more specifically, to a voltage level shifter 232 and voltage level shifter 234. Level shifters 232 and 234 may be controlled by a signal (ldvnxl) from the additional control circuitry such that the level shifters output the first and second negative voltages when the ldvnxl signal is active and a ground potential when ldvnxl is inactive. While shown with a single negative switch 230 in the embodiment of FIG. 2, it is to be understood that a memory device in accordance with an embodiment having a block-oriented architecture, such as a flash memory, may include a negative switch for each block of the memory array. Negative switch 230 transfers the first and second negative voltages to respective x-decoders of a block of the memory array with which it is associated.

Still referring to FIG. 2, for each wordline of the memory array, an x-decoder 240 may be present. Such a decoder may be used to provide the desired negative voltage to a deselected wordline with which it is associated, while also being capable of providing a high voltage programming pulse when the wordline is selected for programming.

Specifically, x-decoder 240 may include a triple well n-channel transistor M0 coupled such that the second negative voltage may bias a P-well of the transistor. When so biased and an associated wordline 260 is deselected, transistor M0 passes the first negative voltage signal onto deselected wordline 260. In the embodiment of FIG. 2, this negative voltage is a −1 volt signal.

More so, similar circuitry present in x-decoder circuitry of all other deselected wordlines of a given block of a memory array may supply a negative voltage to its corresponding wordline. However, at the same time, an x-decoder of a selected wordline may be biased such that the corresponding n-channel transistor M0 for the selected wordline is not even partially turned on. That is, for the selected wordline, the corresponding M0 transistor may be maintained off so that it does not pull down the wordline voltage of the selected wordline.

As further shown in FIG. 2, x-decoder 240 includes a P-type transistor 247 having a drain terminal coupled in series with a drain terminal of transistor M0 at node 248. The gate terminals of transistors M0 and transistor 247 are coupled together, and a source terminal of transistor 247 is coupled to signal HHVPX. Collectively, transistors 247 and M0 may act as a driver for wordline 260.

X-decoder 240 also includes pre-driver circuitry to provide a programming pulse and other voltages desired for other operations of the memory cell. More specifically, x-decoder 240 includes a P-type transistor 241 having a source terminal coupled to signal HHVPIX and a gate terminal coupled to HHAWL. Further, the source terminal of transistor 241 is coupled to the substrate of the transistor. A drain terminal of transistor 241 is coupled in series to four n-type transistors 242-245. At one end of the transistor chain, the source terminal of transistor 245 is coupled to ground. While not shown in FIG. 2, it is to be understood that transistors 242-245 are coupled to receive select signals such as address signals and block select signals to control the discharge of an intermediate node 246 by providing a path to ground when all of transistors 242-245 are turned on.

As further shown in FIG. 2, intermediate node 246 is coupled between the drain terminal of transistor 241 and the drain terminal of transistor 242 and is further coupled to the gate terminals of transistors M0 and 247.

In accordance with the embodiment of FIG. 2, for a selected wordline transistors 242-245 may have select signals enabled such that intermediate node 246 is provided a path to ground. Thus for a selected x-decoder 240, with intermediate node 246 at a ground potential, transistor 247 is turned on to pass a programming pulse HHVPX onto wordline 260, and transistor M0 is turned off.

For a deselected x-decoder 240, at least one of transistors 242-245 will not be selected and thus a path to ground is not established. Accordingly, when transistor 241 is enabled via an active HHAWL signal, the voltage HHVPIX is passed onto intermediate node 246. In certain embodiments, the voltage of the HHVPIX signal may be between approximately 4-5 volts. In such manner, transistor M0 is turned on to pass the first negative voltage onto wordline 260, while transistor 247 is turned off.

Wordline 260 is coupled to a select gate of transistor 255 of a memory cell 250. While shown as having a single cell 250, it is to be understood that a multitude of such flash cells may be present, including a number of cells coupled to the same wordline 260. Further shown in FIG. 2 is a +5 volt signal applied to a drain terminal of transistor 255. Such a 5 volt signal may be used to provide desired biasing for a programming operation of memory cell 250.

In various embodiments, all deselected wordlines of a memory device may be provided with a negative voltage. In such manner, IDTO leakage may be reduced, thereby reducing intrinsic charge loss (ICL) by 200 millivolts. In other embodiments, deselected wordlines may be taken to a negative voltage greater than −1 volt. While such negative voltages may vary, in certain embodiments a negative voltage of between approximately −1 volt to −3 volts may be effected. In still further embodiments, greater negative voltages may be supplied. For example, by applying a greater negative voltage at the P-well of transistor M0, its threshold voltage ($V_T$) may be further raised and an even greater negative voltage may be passed to deselected wordlines.

Thus in many embodiments, it is desirable to provide a second negative voltage to the substrate of transistor M0 in order to raise its $V_T$ such that for a selected x-decoder 240, transistor M0 is not partially turned on, while for deselected x-decoders a greater negative voltage may be passed to associated wordlines. For example, if no −3 volt signal were applied to the substrate of transistor M0, and the gate of M0 was at approximately ground as for a selected cell, if the HNVNX signal applied to the source terminal of M0 was any voltage greater than the threshold voltage (e.g., more negative than approximately −0.7 volts in the embodiment of FIG. 2), the device would start to turn on, causing both p-transistor 247 and n-transistor M0 to be active, pulling down the wordline voltage of the selected cell. Instead, by providing a second negative voltage to the substrate of transistor M0 via the HNVNPWX signal, the $V_T$ of the transistor may be raised to approximately 1.3 volts (if HNVNPWX is at −3 volts). In such manner, a −1 volt HNVNX signal applied to the source terminal of transistor M0 does not cause the transistor to turn on, even if its gate terminal is at approximately ground potential.

While discussed above in regard to the embodiment shown in FIG. 2, in other embodiments a different arrangement of devices or other structures may be used to provide a negative voltage to deselected wordlines. Further, embodiments of the present invention may be performed using instructions implemented in logic circuits embedded inside a monolithic semiconductor memory device, or a software algorithm executed by a controller stacked with memory inside a multi-chip memory subsystem package. For example, in one embodiment an algorithm for providing negative voltages may be implemented in microcode of a flash memory device, such as within a coprocessor within the device. Alternately, a software algorithm may be executed by an external processor separate from the memory subsystem.

Thus embodiments of the present invention may be implemented in code and may be stored on a storage medium having stored thereon instructions which can be used to program a system, such as a wireless device to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs), erasable programmable read-only memories (EPROMs), flash memories, electrically erasable programmable read-only memories (EEPROMs), magnetic or optical cards, a SONOS memory, a phase-change or ferroelectric memory, or any type of media suitable for storing electronic instructions.

Figure 3:
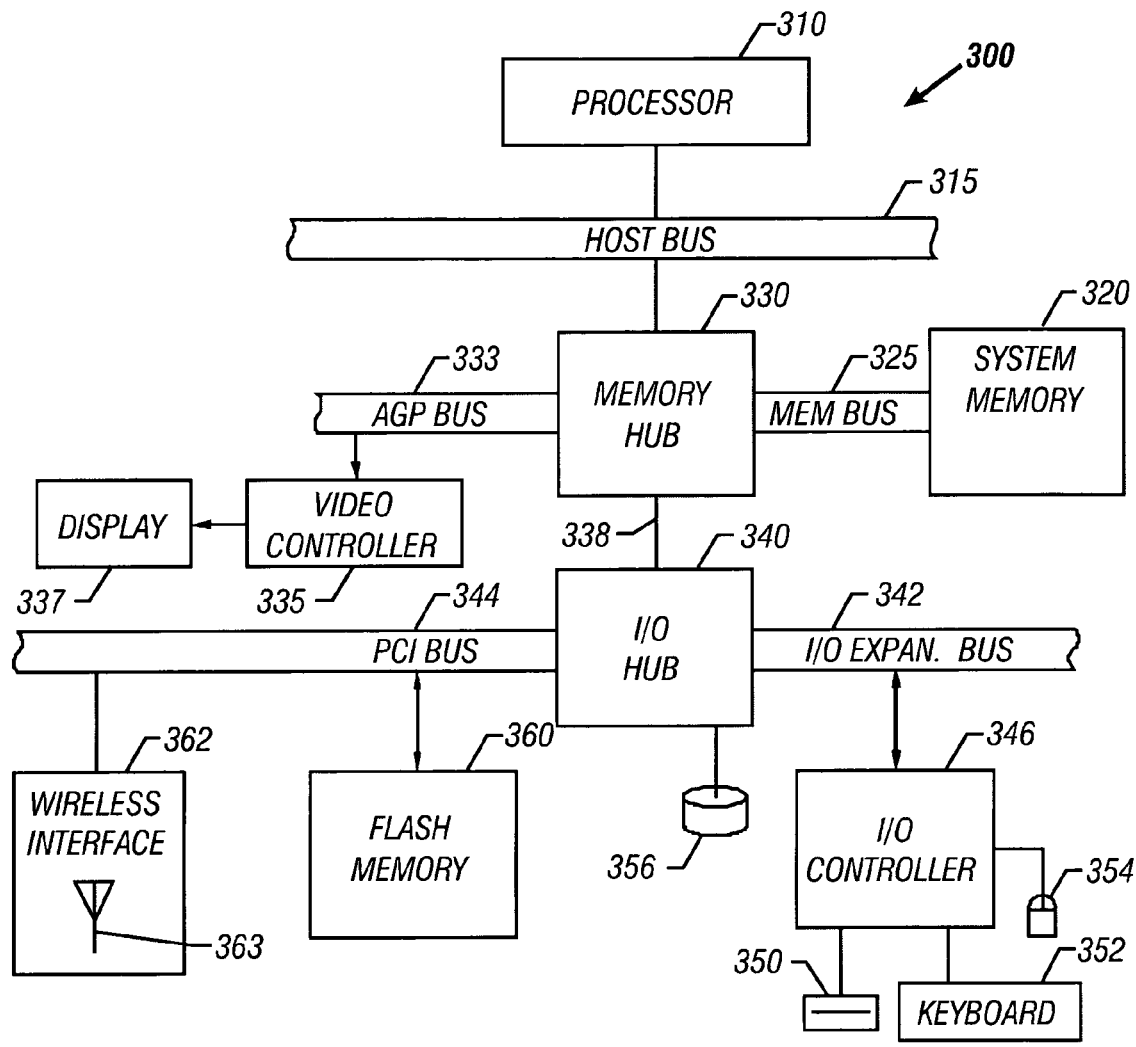
FIG. 3 is a block diagram of a system in accordance with one embodiment of the present invention.

FIG. 3 is a block diagram of a representative data processing system, namely computer system 300 with which embodiments of the invention may be used. In one embodiment, computer system 300 includes a processor 310, which may include a general-purpose or special-purpose processor such as a microprocessor, microcontroller, application specific integrated circuit (ASIC), a programmable gate array (PGA), and the like.

The processor 310 may be coupled over a host bus 315 to a memory hub (i.e., a memory controller) 330 in one embodiment, which may be coupled to a system memory 320 via a memory bus 325. The memory hub 330 may also be coupled over an Advanced Graphics Port (AGP) bus 333 to a video controller 335, which may be coupled to a display 337. The AGP bus 333 may conform to the Accelerated Graphics Port Interface Specification, Revision 2.0, published May 4, 1998, by Intel Corporation, Santa Clara, Calif.

Memory hub 330 may control the transfer of information within system 300, e.g., between processor 310, memory hub 330, and memory 320. That is, memory hub 330 may generate control signals, address signals, and data signals that may be associated with a particular write or read operation to memory 320.

In some embodiments, memory hub 330 may be integrated with processor 310 and/or with memory 320. In alternate embodiments, memory hub 330 may be a discrete component or dedicated chip. In other embodiments, portions of the functionality of memory hub 330 may be implemented in processor 310 or in memory 320 as, for example, a software application, module, or routine.

The memory hub 330 may also be coupled (via a hub link 338) to an input/output (I/O) hub 340 that is coupled to a input/output (I/O) expansion bus 342 and a Peripheral Component Interconnect (PCI) bus 344, as defined by the PCI Local Bus Specification, Production Version, Revision 2.1 dated in June 1995, or alternately a bus such as the PCI Express bus, or another third generation I/O interconnect bus. The I/O expansion bus 342 may be coupled to an I/O controller 346 that controls access to one or more I/O devices. As shown in FIG. 3, these devices may include in one embodiment storage devices, such as a floppy disk drive 350 and input devices, such as keyboard 352 and mouse 354. The I/O hub 340 may also be coupled to, for example, a hard disk drive 356 as shown in FIG. 3. It is to be understood that other storage media may also be included in the system. In an alternate embodiment, the I/O controller 346 may be integrated into the I/O hub 340, as may other control functions.

The PCI bus 344 may be coupled to various components including, for example, a flash memory 360 which may include the structures shown in the schematic diagrams of FIGS. 1 and 2. Further shown in FIG. 3 is a wireless interface 362 coupled to the PCI bus 344, which may be used in certain embodiments to communicate with remote devices. As shown in FIG. 3, wireless interface 362 may include a dipole or other antenna 363 (along with other components not shown in FIG. 3). In various embodiments, wireless interface 362 may be coupled to system 300, which may be a notebook personal computer, via an external add-in card, or an embedded device. In other embodiments wireless interface 362 may be fully integrated into a chipset of system 300.

Although the description makes reference to specific components of the system 300, it is contemplated that numerous modifications and variations of the described and illustrated embodiments may be possible. More so, while FIG. 3 shows a block diagram of a system such as a notebook personal computer, it is to be understood that embodiments of the present invention may be implemented in another wireless device such as a cellular phone, personal digital assistant (PDA) or the like. In such embodiments, a flash memory in accordance with an embodiment may be coupled to an internal bus which is in turn coupled to a microprocessor and a peripheral bus, which may in turn be coupled to a wireless interface and an associated antenna such as a dipole antenna, helical antenna, global system for mobile communication (GSM) antenna, and the like.

In various embodiments, biasing deselected wordlines with a negative voltage may reduce intrinsic charge loss by 200 millivolts, thus improving cycling performance. With such negative deselected rows, an erase verify (EV) level may be reduced by as much as 300 millivolts, thus gaining margin in read window thresholds. Further, in embodiments in which sub-threshold leakage in deselected memory cells is effected during programming, programming pump size may be reduced, thereby minimizing die size. Further, a higher programming bandwidth may be provided, thereby reducing programming time.

In certain embodiments, a negative voltage may be supplied to deselected wordlines during an erase leaky column (ELC) repair portion of an erase algorithm, permitting determination of a leaky cell. In such manner, test time may be reduced, in certain embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   supplying a negative voltage to at least one deselected wordline of a non-volatile memory array from a decoder coupled to the at least one deselected wordline during a programming operation on a selected wordline;
   providing the negative voltage and a control negative voltage to the decoder, further comprising providing the control negative voltage to a substrate of a transistor of the decoder coupled to pass the negative voltage to the at least one deselected wordline; and
   supplying a program pulse to the deselected wordline of the non-volatile memory array if the deselected wordline becomes a selected wordline while supplying the negative voltage.

2. An apparatus comprising:
   a decoder to supply a negative voltage to a deselected address line of a memory array, the decoder comprising a first transistor of a first polarity coupled to receive a negative control voltage and the negative voltage and to pass the negative voltage to the deselected address line, and a second transistor of a second polarity coupled to the first transistor and the deselected address line to pass a program pulse to the deselected address line if it becomes a selected address line, the decoder further comprising a pre-driver circuit to control an intermediate node coupled to a gate terminal of the first transistor and a gate terminal of the second transistor.

3. The apparatus of claim 2, wherein the decoder is further coupled to supply a positive voltage to the same address line if it is selected to be programmed.

4. The apparatus of claim 2, wherein the pre-driver circuit is to disable the first transistor if the deselected address line becomes a selected address line.

5. The apparatus of claim 2, further comprising a plurality of memory cells coupled to the decoder via the deselected address line.

6. The apparatus of claim 5, wherein the plurality of memory cells comprise multi-level cells of a flash memory.

7. The apparatus of claim 2, wherein the first transistor comprises a well coupled to receive the negative control voltage, a source terminal coupled to receive the negative voltage, and a drain terminal coupled to pass the negative voltage to the deselected address line.

8. The apparatus of claim 2, wherein the pre-driver circuit further comprises a transistor chain to provide a ground potential to the intermediate node if the deselected address line is selected to be programmed.

9. The apparatus of claim 8, wherein the transistor chain comprises a plurality of series-coupled transistors of the first polarity having a top transistor having a first terminal coupled to the intermediate node, the first terminal further coupled to a first terminal of a third transistor of the second polarity.

10. An article comprising a machine-readable storage medium containing instructions that if executed enable a system to:
    supply a negative voltage to at least one deselected wordline of a memory array;
    provide a negative control voltage to a substrate of a transistor coupled to pass the negative voltage to the at least one deselected wordline;
    supply a positive voltage to a selected wordline of the memory array to program the selected wordline while the negative voltage is supplied to the at least one deselected wordline; and
    control a first pre-driver circuit coupled to the at least one deselected wordline to pass a positive control voltage to a first control node coupled to a first pair of transistors of different polarities, and to control a second pre-driver circuit coupled to the selected wordline to discharge a second control node coupled to a second pair of transistors of different polarities.

11. The article of claim 10, further comprising instructions that if executed enable the system to supply the negative voltage to all wordlines of the memory array except the selected wordline.

12. The article of claim 10, further comprising instructions that if executed enable the system to supply the negative voltage to the deselected wordline during a first time period, and supply the positive voltage to the same wordline during a second time period to program at least one memory cell coupled thereto.

13. A system comprising:
a nonvolatile memory array having a plurality of memory cells each coupled to a wordline and a bitline;
a decoder coupled to the nonvolatile memory array to supply a negative voltage to a deselected wordline of the nonvolatile memory array, wherein the decoder comprises a first transistor of a first polarity to pass the negative voltage to the deselected wordline and a second transistor of a second polarity coupled to the first transistor to pass a program voltage, if the deselected wordline becomes a selected wordline; and
a wireless interface coupled to the nonvolatile memory array.

14. The system of claim 13, wherein the decoder is further coupled to supply a positive voltage to the deselected wordline if it becomes a selected wordline.

15. The system of claim 13, further comprising a second decoder to supply a positivevoltage to a selected wordline while the negative voltage is supplied to the deselected wordline.

16. system of claim 13, wherein the first transistor comprises a well coupled to receive a negative control voltage, a source terminal coupled to receive the negative voltage, and a drain terminal coupled to pass the negative voltage to the deselected wordline.

17. The system of claim 13, further comprising a pre-driver circuit to disable the first transistor if the deselected wordline becomes a selected wordline, wherein the pre-driver circuit comprises a transistor chain coupled to an intermediate node coupled to a gate terminal of the first transistor, wherein the transistor chain is to provide a ground potential to the intermediate node to disable the first transistor.

18. The system of claim 13, wherein the nonvolatile memory array comprises a flash memory.

19. The system of claim 13, wherein the flash memory comprises a multi-level cell flash memory.

20. The system of claim 13, wherein the wireless interface comprises an antenna.

21. The system of claim 13, further comprising a negative switch coupled to provide the negative voltage and a negative control voltage to the decoder.

22. The system of claim 21, wherein the negative switch is coupled to further provide the negative voltage and the negative control voltage to a second decoder coupled to another wordline of the non-volatile memory array.

* * * * *

UNITED STATES PATENT AND TRADEMARK OFFICE
CERTIFICATE OF CORRECTION

PATENT NO. : 7,319,616 B2  Page 1 of 1
APPLICATION NO. : 10/713841
DATED : January 15, 2008
INVENTOR(S) : Rajesh Sundaram et al.

It is certified that error appears in the above-identified patent and that said Letters Patent is hereby corrected as shown below:

Column 9:
Line 21, "positivevoltage" should be --positive voltage--;
Line 24, before "system" insert --The--.

Column 10:
Line 12, "claim 13" should be --claim 18--.

Signed and Sealed this

First Day of July, 2008

JON W. DUDAS
*Director of the United States Patent and Trademark Office*